(12) United States Patent
Boardman et al.

(10) Patent No.: US 6,358,675 B1
(45) Date of Patent: Mar. 19, 2002

(54) SILICON-CONTAINING ALCOHOLS AND POLYMERS HAVING SILICON-CONTAINING TERTIARY ESTER GROUPS MADE THEREFROM

(75) Inventors: Larry D. Boardman, Woodbury; Carl R. Kessel, St. Paul, both of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/411,709

(22) Filed: Sep. 30, 1999

Related U.S. Application Data

(60) Provisional application No. 60/148,022, filed on Aug. 10, 1999, provisional application No. 60/119,438, filed on Feb. 10, 1999, and provisional application No. 60/102,963, filed on Oct. 2, 1998.

(51) Int. Cl.[7] .............................. G03C 5/16; G03C 5/56; G03C 1/73; C08F 30/08; C08G 77/00; C07C 29/00
(52) U.S. Cl. ..................... 430/326; 430/270.1; 430/910; 430/914; 430/905; 526/279; 526/281; 526/319; 528/41; 560/183; 560/120; 568/840
(58) Field of Search .............................. 430/270.1, 326, 430/910, 905, 914; 526/279, 313, 371.1, 319, 281; 560/205, 8, 183, 120; 528/41; 568/840, 715

(56) References Cited

U.S. PATENT DOCUMENTS

| | | | |
|---|---|---|---|
| 3,666,473 A | 5/1972 | Colom et al. | 430/192 |
| 4,115,128 A | 9/1978 | Kita | 430/191 |
| 4,173,470 A | 11/1979 | Fahrenholtz et al. | 430/5 |
| 4,916,247 A | 4/1990 | Steinmann | 556/82 |

FOREIGN PATENT DOCUMENTS

| | | |
|---|---|---|
| EP | 0 439 289 A2 | 7/1991 |
| EP | 0 447 111 A1 | 9/1991 |
| EP | 0 460 941 A2 | 12/1991 |
| EP | 0 758 102 A1 | 2/1997 |

OTHER PUBLICATIONS

Sooriyakumaran et al., "Positive Bylayer Resists for 248 and 193 nm Lithography", SPIE—The International Society For Optical Engineering, vol. 3333, No. 1, Feb. 1998, pp. 219–227.

(List continued on next page.)

*Primary Examiner*—Janet Baxter
*Assistant Examiner*—Sin J. Lee
(74) *Attorney, Agent, or Firm*—Scott A. Bardell

(57) ABSTRACT

The polymers of the invention are characterized by having at least one pendent ester group having a tertiary carbon atom attached to the ester oxygen atom in which at least one substituent of the tertiary carbon atom comprises at least one silicon atom. The polymer compositions of the present invention are useful as resist materials for lithography, in particular as the imaging layer or as the top imaging layer in a bilayer resist scheme for use in the manufacture of integrated circuits. The silicon-containing tertiary alcohols and esters of the present invention enable the preparation of polymers with relatively high silicon content.

59 Claims, 1 Drawing Sheet

OTHER PUBLICATIONS

Kang et al., "Chemically Amplified Silicon Containing Resist for ArF Excimer Laser Lithography", Journal of Photopolymer Science and Technology, vol. 10, No. 4, 1997, pp. 585–588.

C.G. Willson in *Introduction to Microlithography* (American Chemical Society, 1994, pp. 212–231).

B.J. Lin and T.H.P. Chang, *J. Vac. Sci. Tech.* 1979, 16, pp. 1669–1671.

B.J. Lin, *Solid State Technol.*, 1983, 26 (5), p. 105–112.

T. Ueno in *Microlithography Science and Technology*, Marcel Decker, pp. 429–464, (1998).

Shida et al., *Chemically Amplified ArF Resists Based on Cleavable Alicyclic Group and the Absorption Band Shift Method*, Sponsored and Published by SPIE—The International Society of Optical Engineering, vol. 3333, pp. 102–110.

Tietze et al. *Preparation of Enantiopure Precursors for the Vitamin E Synthesis, A comparison of the Asymmetric Allylation of Ketones and the Sharpless Bishydroxylation*, Synlett, vol. 9 pp. 1049–1050, Sep. 1997.*

Cermenati et al *Set and Exciplex Pathways in the Photochemical Reactions between Aromatic Ketones & Benzylsilane and Stannane Derivatives*, J. Am. Chem. Soc. (1995), 117 (30), p. 7869–76, 1995.*

* cited by examiner

SILICON-CONTAINING ALCOHOLS AND POLYMERS HAVING SILICON-CONTAINING TERTIARY ESTER GROUPS MADE THEREFROM

CROSS REFERENCE TO RELATED PROVISIONAL APPLICATION

This application claims the benefit of U.S. Provisional Application Nos. 60/102,963, filed Oct. 2, 1998; 60/119,438, filed Feb. 10, 1999; and 60/148,022, filed Aug. 10, 1999.

BACKGROUND OF THE INVENTION

The present invention relates to resist materials for use in lithography, for example, in the production of integrated circuits and particularly to polymers having pendent silicon-containing ester protecting groups. The present invention also relates to silicon-containing alcohols and esters.

It is well known in the art to produce positive photoresist formulations such as those described in U.S. Pat. Nos. 3,666,473; 4,115,128; and 4,173,470. These include alkali-soluble phenol-formaldehyde novolac resins together with light-sensitive materials, usually a substituted diazonaphthoquinone compound. The resins and sensitizers are dissolved in an organic solvent or mixture of solvents and are applied as a thin film or coating to a substrate suitable for the particular application desired.

The resin component of these photoresist formulations is soluble in aqueous alkaline solutions, but the naphthoquinone compound acts as a dissolution rate inhibitor with respect to the resin. Upon exposure of selected areas of the coated substrate to actinic radiation, however, the naphthoquinone compound undergoes a radiation induced structural transformation, and the exposed areas of the coating are rendered more soluble than the unexposed areas. This difference in solubility rates causes the exposed areas of the photoresist coating to be dissolved when the substrate is inunersed in an alkaline developing solution while the unexposed areas are largely unaffected, thus producing a positive relief pattern on the substrate.

An alternative method for forming the pattern in a resist is referred to as chemical amplification. This method is described by C. G. Willson in *Introduction to Microlithography* (American Chemical Society, 1994, pp. 212–231). In this method, a photoacid generator is added to a polymer containing acid-labile groups. When a coating of this mixture is exposed to actinic radiation in an imagewise fashion, the photoacid generator in those areas struck by light will produce acid, and this acid causes a reaction of the acid-labile groups in the polymer. The polymer that has reacted in this manner is rendered soluble in aqueous base, and the image can be developed in the same manner as described above. Chemically amplified resist systems typically require a much lower dose of actinic radiation to effectively develop the pattern than do the novolac/diazoquinone type resist systems.

In most instances, the exposed and developed photoresist on the substrate will be subjected to treatment by a substrate-etchant solution or gas. The photoresist coating protects the coated areas of the substrate from the etchant, and thus the etchant is only able to etch the uncoated areas of the substrate, which in the case of a positive photoresist, correspond to the areas that were exposed to actinic radiation. Thus, an etched pattern can be created on the substrate which corresponds to the pattern on the mask, stencil, template, etc., that was used to create selective exposure patterns on the coated substrate prior to development.

The relief pattern of the photoresist on the substrate produced by the method described above is useful for various applications including as an exposure mask or a pattern such as is employed in the manufacture of miniaturized integrated electronic components.

The properties of a photoresist composition which are important in commercial practice include the photospeed of the resist, development contrast, resist resolution, and resist adhesion.

Resist resolution refers to the capacity of a resist system to reproduce the smallest features from the mask to the resist image on the substrate.

In many industrial applications, particularly in the manufacture of miniaturized electronic components, a photoresist is required to provide a high degree of resolution for very small features (on the order of two microns or less).

The ability of a resist to reproduce very small dimensions, on the order of a micron or less, is extremely important in the production of large-scale integrated circuits on silicon chips and similar components. Circuit density on such a chip can only be increased, assuming photolithography techniques are utilized, by increasing the resolution capabilities of the resist.

Photoresists are generally categorized as being either positive working or negative working. In a negative working resist composition, the imagewise light-struck areas harden and form the image areas of the resist after removal of the unexposed areas with a developer. In a positive working resist composition, the exposed areas are the non-image areas. The light-struck parts are rendered soluble in aqueous alkali developers. While negative resists are the most widely used for industrial production of printed circuit boards, positive resists are capable of much finer resolution and smaller imaging geometries. Hence, positive resists are the choice for the manufacture of densely packed integrated circuits.

In the normal manner of using a positive photoresist, a single layer of this material is imaged to give a mask on the substrate, which can further be etched with a suitable etchant or used for deposition of materials, such as metals. However, due to the limitations of optical imaging systems, resolution of small patterns, on the order of two microns or less, is limited, particularly if topography is present on the substrate. It was discovered by B. J. Lin and T. H. P. Chang, *J. Vac. Sci. Tech.*, 1979, 16, p. 1669, that this resolution can be further improved by using multilevel systems to form a portable conformable mask.

In the conventional two-layer resist system (B. J. Lin, *Solid State Technol.*, 1983, 26 (5), p. 105), patterns with a high aspect ratio can be obtained by anistropically etching the substrate by oxygen plasma etching ($O_2$RIE) using a thin film of the resist formed on the substrate as a mask. Hence, much importance is given to the resistance of the resist to $O_2$RIE. Generally, those materials that form oxides upon $O_2$RIE, typically those containing silicon (Si), are considered to have high resistance to $O_2$RIE.

SUMMARY OF THE INVENTION

The polymers of the invention are characterized by a polymeric backbone having at least one pendent ester group having a tertiary carbon atom attached to the ester oxygen atom in which at least one substituent of the tertiary carbon atom is an organic group which comprises at least one silicon atom. The polymer compositions of the present invention are useful as resist materials for lithography, as the imaging layer, or as the top imaging layer in a bilayer resist scheme for use in the manufacture of integrated circuits. The incorporation of silicon in the polymers of the present invention enables the formation of a robust etch mask upon exposure to the oxygen plasma used in reactive ion etching processes. The silicon-containing tertiary alcohols of the present invention enable the preparation of polymers with relatively high silicon content.

In one aspect, the invention provides a polymer comprising a polymeric backbone having at least one pendent ester functional group having a tertiary carbon atom attached to the ester oxygen atom in which at least one organic substituent attached to the tertiary carbon atom comprises at least one silicon atom.

In another aspect, the invention provides a tertiary alcohol in which at least one organic substituent attached to the tertiary carbon atom comprises at least one silicon atom.

In another aspect, the invention provides an ester of a tertiary alcohol in which at least one organic substituent attached to the tertiary carbon atom comprises at least one silicon atom.

In another aspect, the invention provides a method of forming resist patterns comprising the steps of:

a) providing a polymer comprising a polymeric backbone having at least one pendent ester functional group having a tertiary carbon atom attached to the ester oxygen atom in which at least one organic substituent attached to the tertiary carbon atom comprises at least one silicon atom;

b) coating the silicon-containing polymer onto a substrate;

c) exposing the coated substrate to actinic radiation sufficient to form a latent image; and d) developing the latent image.

The substrate may also be coated with an organic polymer base layer as a part of a bilayer resist.

The silicon-containing alcohols and esters of the invention may be converted into a variety of reactive monomers that may in turn be used to prepare polymers which can be incorporated into compositions useful as resist materials for lithography.

DETAILED DESCRIPTION OF THE PREFERRED EMBODIMENTS

Figure 1:
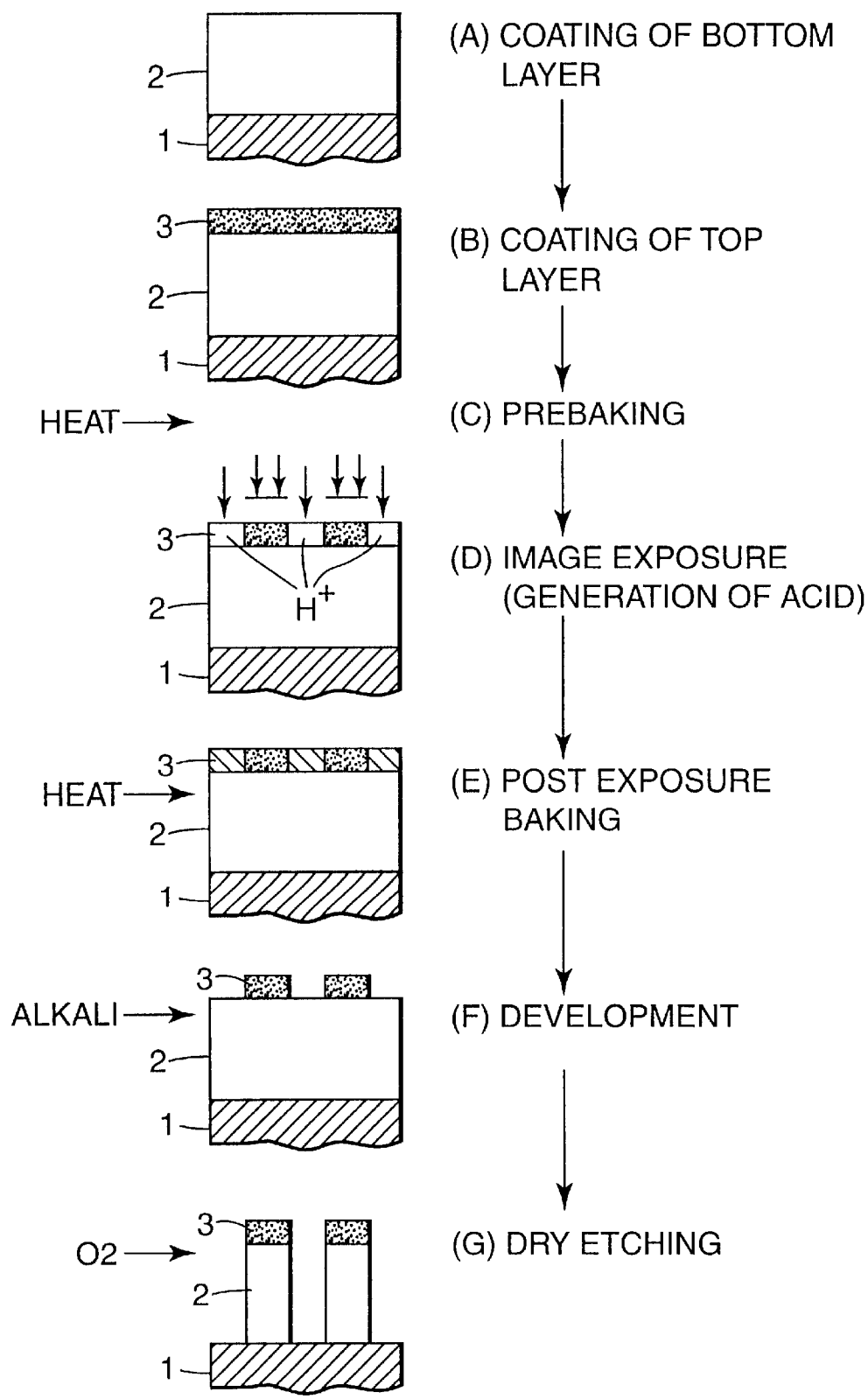
FIG. 1 is cross-sectional views illustrating a process of forming resist patterns according to the present invention.

The backbone of the polymers of the invention may be any polymeric chain of monomers capable of being developed provided that the backbone chemistry allows for the polymers of the invention; that is, polymers having at least one pendent ester functional group having a tertiary carbon atom attached to the ester oxygen atom in which at least one substituent attached to the tertiary carbon atom comprises at least one silicon atom. As used herein, "polymeric backbone" does not include the pendent silicon-containing tertiary ester portion of the particular monomer used.

Suitable polymeric backbones for the polymers of the invention include homopolymers and copolymers of monomers comprising vinyl phenols, (meth)acrylic acids, alkyl (meth)acrylates, maleic anhydrides, norbornenes, alkyl norbornenes, vinylbenzoic acids, alkyl vinylbenzoates, and olefins such as ethylene, propylene, and the like.

Preferred monomers of the polymeric backbones for the polymers of the invention are maleic anhydrides, (meth)acrylic acids, norbornenes, and alkyl (meth)acrylates. More preferred monomers of the polymeric backbones are maleic anhydride, acrylic acid, methacrylic acid, methyl acrylate, methyl methacrylate, tert-butyl acrylate, tert-butyl methacrylate, norbornene, norbornene methanol, norbornene carboxylic acid, 2-hydroxyethyl acrylate, and 2-hydroxyethyl methacrylate.

The polymers of the invention are constructed of repeating monomer units represented by the formula:

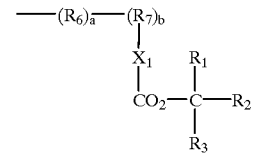

wherein each $X_1$ is independently a divalent connecting group or a covalent bond; each of $R_1$, $R_2$, and $R_3$ is independently an alkyl, aryl, aralkyl, or silyl group, with the proviso that at least one of $R_1$, $R_2$, and $R_3$ is a silicon-containing group of the formula $X_2Si(R_5)_3$ wherein $X_2$ is independently a divalent connecting group or a covalent bond and each $R_5$ is independently an alkyl, aryl, aralkyl, silyloxy, or silyl group; each $R_6$ and $R_7$ is independently a divalent radical of a polymeric backbone monomer; a is independently 0 or an integer 1 or greater, b is independently an integer 1 or greater.

Useful substituents represented by $R_6$ and $R_7$ include divalent radicals of monomers of vinyl phenols, (meth)acrylic acids, alkyl (meth)acrylates, maleic anhydrides, norbornenes, alkyl norbornenes, vinylbenzoic acids, alkyl vinylbenzoates, and olefins such as ethylene and propylene. Preferred $R_6$ and $R_7$ substituents are divalent radicals of monomers of (meth)acrylic acids, norbornenes, and alkyl (meth)acrylates. More preferred $R_6$ and $R_7$ substituents are divalent radicals of monomers of acrylic acid, methacrylic acid, methyl acrylate, methyl methacrylate, tert-butyl acrylate, tert-butyl methacrylate, norbornene, norbornene methanol, norbornene carboxylic acid, 2-hydroxyethyl acrylate, and 2-hydroxyethyl methacrylate.

Preferably, the polymers of the invention are constructed of repeating monomer units represented by the formula:

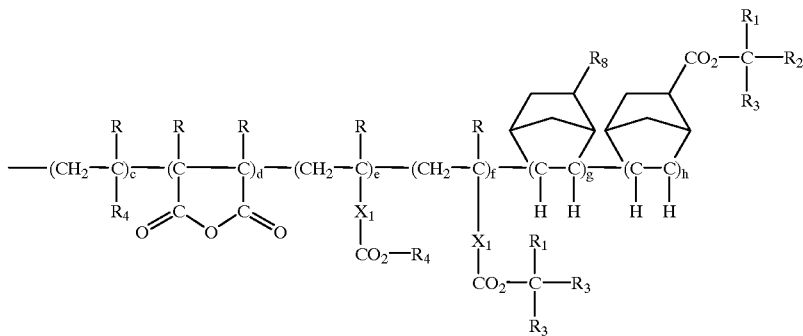

wherein $R_1$, $R_2$, and $R_3$ are defined above; each $R_4$ is independently an alkyl, aryl, or aralkyl group, or a hydrogen atom; each $R_8$ is independently an alkyl, aryl, aralkyl, carboxyl, or alkoxy carbonyl group, or a hydrogen atom; c, d, e, f, g, and h are independently 0 or an integer 1 or greater, with the proviso that at least one of f or h is an integer 1 or greater; and each R is independently a hydrogen atom or a methyl group.

Useful divalent substituents represented by $X_1$ and $X_2$ include branched or unbranched and/or substituted or unsubstituted groups including —$CH_2n$)— wherein n is an integer from 1 to 18, preferably an integer from 1 to 8, arylene, cyclohexylene, aralkylene, and the like. Preferably, $X_1$ is a covalent bond. Preferably, $X_2$ is an alkylene group.

Preferred $R_1$, $R_2$, and $R_3$ substituents are alkyl groups containing from 1 to 8 carbon atoms, (trialkylsilyl)alkyl, [(trialkylsilyloxy)dialkylsilyl]alkyl, [bis(trialkylsilyloxy)alkylsilyl]alkyl, [tris(trialkylsilyloxy)silyl]alkyl, [(trialkylsilyl)dialkylsilyl]alkyl, [bis(trialkylsilyl)alkylsilyl]alkyl, [tris(trialkylsilyl)silyl]alkyl, [tris(trialkylsilyl)methyl]alkyl, and {[tris(trialkylsilyl)methyl]dialkylsilyl}alkyl.

More preferred $R_1$, $R_2$, and $R_3$ substituents are independently methyl, ethyl, 2-(trimethylsilyl)ethyl, 2-[(trimethylsilyloxy)dimethylsilyl]ethyl, 2-[bis(trimethylsilyloxy)methylsilyl]ethyl, 2-[tris(trimethylsilyloxy)silyl]ethyl, 2-[(trimethylsilyl)dimethylsilyl]ethyl, 2-[bis(trimethylsilyl)methylsilyl]ethyl, 2-[tris(trimethylsilyl)silyl]ethyl, 3,3,3-tris(trimethylsilyl)propyl, 2-{tris(trimethylsilyl)methyl]dimethylsilyl}ethyl, and 2,2,2-tris(trimethylsilyl)ethyl.

Still more preferred $R_1$, $R_2$, and $R_3$ substituents are independently methyl, ethyl, 2-[tris(trimethylsilyl)silyl]ethyl, 2-[tris(trimethylsilyloxy)silyl]ethyl, 3,3,3-tris(trimethysilyl)propyl, and 2-{tris(trimethylsilyl)methyl]dimethylsilyl}ethyl. Preferably, only one of $R_1$, $R_2$, and $R_3$ is a silicon-containing group of the formula $X_2Si(R_5)_3$ wherein $X_2$ and $R_5$ are as defined above.

Useful substituents represented by $R_4$ include hydrogen and branched or unbranched and/or substituted or unsubstituted groups including alkyl, aryl, and aralkyl groups. Preferred $R_4$ substituents are hydrogen and alkyl groups containing from 1 to 4 carbon atoms.

Useful substituents represented by $R_8$ include hydrogen and branched or linear and/or substituted or unsubstituted groups including alkyl, aryl, aralkyl, carbonyl, and alkoxy carbonyl groups. Preferred $R_8$ groups are hydrogen, hydroxymethyl, carboxyl, methyl, and methoxy carbonyl.

Other preferred polymers of the invention are represented by the formulas:

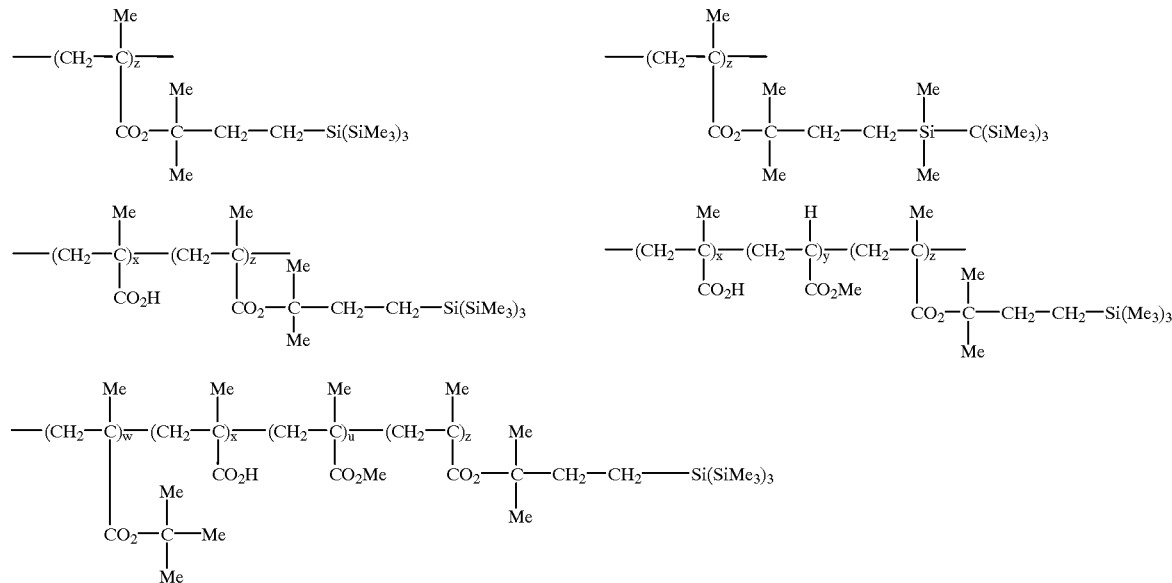

-continued

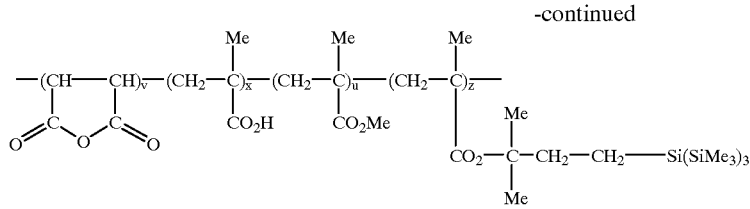

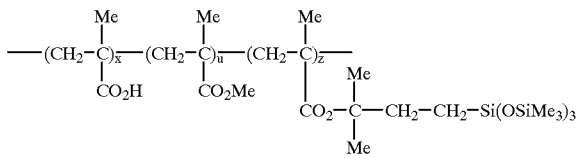

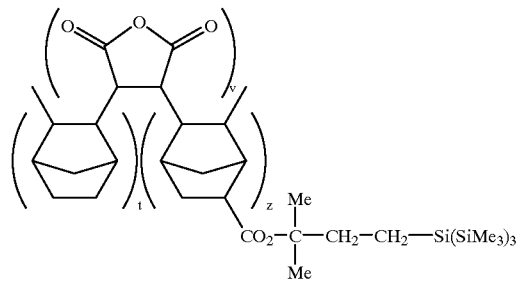

Me = CH₃ wherein t, u, v, w, x, and y are 0 or an integer 1 or greater, and z is an integer 1 or greater. Preferably, x≦50% of t+u+v+w+x+y+z and z≧5% of t+u+v+w+x+y+z.

The polymers of the invention are generally made by the free-radical polymerization of an appropriate mixture of acrylate and/or methacrylate monomers as is well understood by one of ordinary skill in the art.

The tertiary alcohols of the invention are represented by the formula:

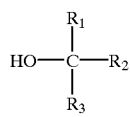

wherein $R_1$, $R_2$, and $R_3$ have the definitions described above. Preferred tertiary alcohols of the invention are represented by the formulas:

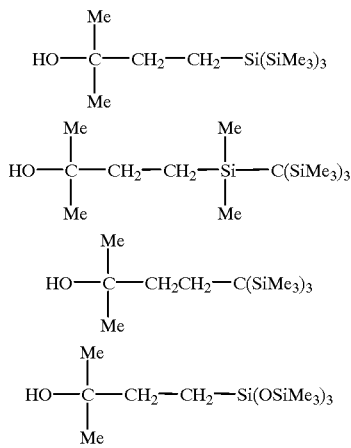

The alcohols of the invention can be prepared by methods well understood by one of ordinary skill in the art.

The tertiary esters of the invention are represented by the formula:

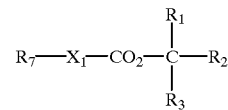

wherein $X_1$, $R_1$, $R_2$, and $R_3$ have the definitions described above and $R_7$ is a monovalent radical of a backbone monomer described above for $R_7$. Preferred esters of the invention are acrylates, methacrylates, and norbornene carboxylates of the preferred alcohols described above.

The esters of the invention are generally prepared by the reaction of an appropriate acryloyl chloride with a tertiary alcohol of the invention.

Useful acid generators of the invention are compounds or compositions, which produce acid on exposure to actinic radiation. Examples of useful acid generators include those described by T. Ueno in *Microlithography Science and Technology*, (Marcel Decker, 1998, pp. 429–464), incorporated herein by reference. Preferred acid generators are onium salts such as diaryliodonium salts and triarylsulfonium salts as described in *Microlithography Science and Technology*, cited above. More preferred acid generators are diaryliodonium salts such as tolylcumyliodonium tetrakis (pentafluorophenyl)borate, diphenyliodonium trifluoromethanesulfonate, bis(4-tolyl)iodonium trifluoromethanesulfonate, and bis(4-tolyl)iodonium perfluorobutanesulfonate.

FIG. 1 shows cross-sectional views illustrating the process of forming resist patterns according to the present invention. First, a thin film of an organic polymer 2 (any suitable and etchable organic polymer film used in the art) is applied to a substrate 1 such as a silicon wafer (primed or unprimed) (step A: coating of a base polymer layer). A thin film of a resist composition of the invention 3 (a polymer of the invention and an acid generator) is applied to the organic polymer film 2 completing a two-layer structure on the substrate (step B: coating of a top layer). The coated substrate is optionally prebaked (step C: prebaking), the top layer is subsequently masked, and the two-layered structure is irradiated through the mask so to release acid from the acid generator contained in the resist composition (step D: imagewise exposure). The coated and exposed wafer is optionally heated to speed the acid-catalyzed cleavage of tertiary ester groups of the polymer of the invention (step E: post exposure baking (also referred to as PEB)). As a result, the masked portion of the resist remains insoluble in an aqueous alkali solution. Thereafter, the exposed resist material in the unmasked region is removed with an alkali developer (step F: development). The patterned two-layered structure is then dry-etched using, for example, an oxygen plasma such that the lower organic polymer film 2 is removed from those areas from which the top layer resist composition of the invention has been removed (step G: dry etching), thus forming a resist pattern. Suitable organic polymers for the base organic layer include any organic polymer material that can be etched with oxygen plasma. The radiation used to form the image in the resist can be of any wavelength that results in release of acid from the acid generator.

EXAMPLES

All of the reactants used in the following examples are available from Aldrich Chemical Company, Inc. (Milwaukee, Wis.) unless otherwise noted.

Example 1

Preparation of 2,6,6-Trimethyl-5,5-bis(trimethylsilyl)-5,6-disilaheptan-2-ol.

A dried reaction flask equipped for magnetic stirring and fitted with a reflux condenser was flushed with nitrogen and charged with toluene (500 mL). Oxygen was purged from the system by passing a stream of nitrogen through the solvent, 2-methyl-3-buten-2-ol (43.1 g, 500 mmol), tris(trimethylsilyl)silane (25.0 g, 100 mmol), and 1,1'-azobis(cyclohexanecarbonitrile) (1.22 g, 5 mmol) were added to the flask, and the reaction mixture was heated for 20 hours at 110° C. with stirring. The resulting solution was concentrated under reduced pressure, and distillation under vacuum (bp 90–104° C. at 0.10 mm) afforded the title compound (25.1 g, 74%) as a colorless solid. The distilled product was characterized by the following NMR data: $^1$H NMR (CDCl$_3$) δ 0.14 (s, 27 H), 0.70–0.80 (m, 2 H), 1.17 (s, 6 H), 1.30 (br s, 1 H), 1.45–1.55 (m, 2 H); $^{13}$C NMR (CDCl$_3$) δ 1.06 (9 C), 1.24 (1 C), 28.35 (2 C), 42.99 (1 C), 71.64 (1 C); $^{29}$Si NMR (CDCl$_3$) δ –80.90 (1 Si), –12.83 (3 Si).

Example 2

Preparation of 2,6,6-Trimethyl-5,5-bis(trimethylsilyl)-5,6-disilahept-2-yl 2-methyl-2-propenoate (Methacrylate Ester 1).

A dried reaction flask equipped for magnetic stirring was flushed with nitrogen and charged with 2,6,6-trimethyl-5,5-bis(trimethylsilyl)-5,6-disilaheptan-2-ol (53.6 g, 160 mmol, prepared as described in Example 1) and dry tetrahydrofuran (400 mL). Triethylamine (78.1 mL, 56.7 g, 560 mmol) and methacryloyl chloride (54.7 mL, 58.5 g, 560 mmol) were added, and the reaction mixture was stirred at room temperature for 24 hours. Analysis of the reaction mixture by gas chromatography indicated the clean formation of a single product. Pentane (500 mL) was added, precipitated triethylamine hydrochloride was separated by filtration, and the filtrate was concentrated under reduced pressure. The turbid concentrate was dissolved in pentane (500 mL), the resultant solution was filtered and concentrated under reduced pressure, and 2,6-di-tert-butyl-4-methylphenol (0.50 g, 2.3 mmol) was added to the concentrate. The concentrate was distilled under vacuum (bp 120–130° C. at 0.05 mm) to afford the title compound (43.5 g, 67%) as a clear, colorless liquid. The distilled product was characterized by the following NMR data: $^1$H NMR (CDCl$_3$) δ 0.13 (s, 27 H), 0.70–0.80 (m, 2 H), 1.43 (s, 6 H), 1.75–1.85 (m, 2 H), 1.87 (s, 3 H), 5.43 (m, 1 H), 5.96 (m, 1 H); $^{13}$C NMR (CDCl$_3$) δ 0.78 (1 C), 0.99 (9 C), 18.30 (1 C), 25.19 (2 C), 40.25 (1 C), 82.83 (1 C), 123.89 (1 C), 137.85 (1 C), 166.36 (1 C); $^{29}$Si NMR (CDCl$_3$) δ –81.26 (1 Si), –12.80 (3 Si).

Example 3

Preparation of Polymer 1 (Homopolymer of Methacrylate Ester 1).

Methacrylate Ester 1 (11.0 g, prepared as described in Example 2) was dissolved in pentane (100 mL), the slightly turbid solution was filtered, and the filtrate was concentrated under reduced pressure to provide a clear, light yellow liquid. The material spontaneously polymerized after standing under vacuum for approximately 2 hours. The crude polymer was dissolved in tetrahydrofuran (25 mL), and the resultant solution was added dropwise, with rapid stirring, to methanol (1.5 L). The precipitated polymer was collected by filtration, washed with methanol, and dried under vacuum to afford the product as a white solid (6.87 g). The $^1$H, $^{13}$C, and $^{29}$Si NMR spectra of the product were consistent with the structure of the homopolymer of Methacrylate Ester 1 ($M_n$=20,000, $M_w$=148,000).

Example 4

Preparation of Polymer 2 (Terpolymer of Methacrylate Ester 1, methacrylic acid, and methyl acrylate).

A reaction flask equipped for magnetic stirring and fitted with a reflux condenser was charged with Methacrylate Ester 1 (14.91 g, 37 mmol, prepared as described in Example 2), methacrylic acid (1.54 g, 18 mmol), methyl acrylate (1.80 g, 21 mmol), 1,1'-azobis(cyclohexanecarbonitrile) (0.48 g, 2 mmol), and ethyl acetate (100 mL). The reaction mixture was degassed by repeated brief application of vacuum to the system followed by the readmission of nitrogen. The reaction mixture was heated at 80° C. for 48 hours. The resulting turbid solution was filtered, and the clear filtrate was concentrated under reduced pressure to afford a light yellow solid. The crude polymer was dissolved in tetrahydrofuran (200 mL), and the resultant solution was added dropwise, with rapid stirring, to methanol (9 L). The polymer separated as a tacky mass. The milky supernatant was decanted, and the precipitated polymer was washed with methanol and dried under vacuum to provide a white solid (7.00 g). The $^1$H, $^{13}$C, and $^{29}$Si NMR spectra of the product were consistent with the structure of an approximately 2:1:1 terpolymer of Methacrylate Ester 1, methacrylic acid, and methyl acrylate ($M_n$=11,000, $M_w$=22,000).

Example 5

The polymer of Example 3 (1.00 g), tolylcumyliodonium tetrakis(pentafluorophenyl)borate (50 mg, available from Rhone Poulenc North America Chemicals, Rock Hill, N.C.), and o-xylene (4.00 g) were combined, and approximately 1.0 mL of the resultant solution was spin coated at 3000 rpm for 60 seconds on a four-inch unprimed silicon wafer. The coated wafer was post-apply baked on a SOLITEC hot plate at 100° C. for 60 seconds, resulting in a 11,345 angstrom thick coating. A mask, consisting of a thin aluminum sheet with multiple holes, was placed over the coated wafer, and the wafer/mask laminate was irradiated in a UV processor fitted with a Fusion Systems H bulb (main line at 365 nm, 100 mJ/cm$^2$ delivered dose). The mask was removed, and the wafer was post-exposure baked on a SOLITEC hot plate at 100° C. for 60 seconds. The wafer was immersed in 0.26 N aqueous tetramethylammonium hydroxide for 30 seconds and rinsed with water. Examination of the wafer after development revealed that the coating had been completely removed from the area that had been exposed to actinic radiation while the unexposed region of the wafer showed no apparent erosion of the applied coating.

Example 6

The polymer of Example 4 (1.00 g), tolylcumyliodonium tetrakis(pentafluorophenyl)borate (50 mg), and propylene glycol methyl ether acetate (4.00 g) were combined. A four-inch unprimed silicon wafer was coated, masked, exposed, and developed substantially as described in Example 5 to produce a 8,473 angstrom thick coating. Examination of the wafer after development revealed that the coating had been completely removed from the area that had been exposed to actinic radiation while the unexposed region of the wafer showed no apparent erosion of the applied coating.

Example 7

A stock solution was prepared by combining poly(4-vinylphenol) (10.00 g, $M_n$=2000, $M_w$=20,000, available from TriQuest, LP, Corpus Christi, Tex.) and propylene glycol methyl ether acetate (40.00 g). Approximately 1.0 mL of this solution was spin coated at 5000 rpm for 60 seconds on a four-inch unprimed silicon wafer. The coated wafer was post-apply baked on a SOLITEC hot plate at 240° C. for 10 minutes, producing a 9,422 angstrom thick coating. The solution of the polymer of Example 4 prepared in Example 6 (1.50 g) and additional propylene glycol methyl ether acetate (1.50 g) were combined, and approximately 1.0 mL of the resultant solution was spin coated at 3000 rpm for 60 seconds on the poly(4-vinylphenol)-coated silicon wafer prepared above. The coated wafer was post-apply baked on a SOLITEC hot plate at 120° C. for 60 seconds, producing a 1,916 angstrom thick coating. The coated silicon wafer was masked, exposed, and developed essentially as described in Example 5. Examination of the wafer after development revealed that the resist coating had been completely removed down to the underlying layer of poly(4-vinylphenol) from the area that had been exposed to actinic radiation, while the unexposed region of the wafer showed no apparent erosion of the applied resist coating.

Example 8

Preparation of 2,6,6-Trimethyl-5,5-bis(trimethylsilyl)-5,6-disilahept-2-yl Bicyclo[2.2.1]hept-5-ene-2-carboxylate (Norbornene Ester 1).

An oven-dried reaction flask equipped for magnetic stirring and fitted with a reflux condenser was flushed with nitrogen and charged with of bicyclo[2.2.1]hept-5-ene-2-carboxylic acid (55.3 g, 0.4 mol) and thionyl chloride (190.0 g, 1.6 mol). The mixture was heated at 50° C. for 2 hours. Excess thionyl chloride was evaporated under reduced pressure, of tetrahydrofuran (20 mL) was added to the concentrate, and volatiles were again separated under reduced pressure. To the amber concentrate, of tetrahydrofuran (200 mL), 2,6,6-Trimethyl-5,5-bis(trimethylsilyl)-5,6-disilaheptan-2-ol (33.5 g, 0.1 mol), and triethylamine (41.0 g, 0.4 mol) were added, and the reaction mixture was heated at 50° C. for 24 hours. The reaction mixture was poured into water (200 mL), the organic phase was separated, and the aqueous phase was extracted three 50 mL portions of diethyl ether. The combined organic phases were washed with one 50 mL portion of saturated aqueous sodium chloride and dried over magnesium sulfate. The mixture was filtered, and the filtrate was concentrated under reduced pressure. The crude product was purified by column chromatography (90:10 hexanes:diethyl ether, $R_f$=0.47 and 0.58), affording the title compound (32.6 g, 72%) as a clear, colorless oil. The $^1$H, $^{13}$C, and $^{29}$Si NMR spectra of the product were consistent with the structure of the title compound as an approximately 55:45 mixture of the endo and exo isomers.

Example 9

Preparation of Polymer 3 (terpolymer of bicyclo[2.2.1]hept-2-ene, Norbornene Ester 1, and maleic anhydride).

A reaction flask equipped for magnetic stirring and fitted with a reflux condenser was charged with Norbornene Ester 1, (20.47 g, 45 mmol), bicyclo[2.2.1]hept-2-ene (4.24 g, 45 mmol), maleic anhydride (8.83 g, 90 mmol), 2,2'-azobis(2-methylpropionitrile) (1.18 g, 7.2 mmol), and tetrahydrofuran (135 mL). The reaction mixture was degassed by repeated brief applications of vacuum to the system followed by the readmission of nitrogen. The reaction mixture was heated at 70° C. for 48 hours. The solution was concentrated under reduced pressure to a volume of approximately 40 mL, and the concentrated solution was added dropwise, with rapid stirring, to hexanes (700 mL). The precipitated polymer was collected by filtration, washed with hexanes, and dried under vacuum to provide a white solid (13.85 g). The $^1$H, $^{13}$C, and $^{29}$Si NMR spectra of the product were consistent with the structure of an approximately 7:3:10 terpolymer of bicyclo[2.2.1]hept-2-ene, Norbornene Ester 1, and maleic anhydride ($M_n$=1500, $M_w$=2100).

Example 10

A resist solution was prepared by combining of the polymer of Example 9 (2.20 g), tolylcumyliodonium tetrakis(pentafluorophenyl)borate (1 16 mg), and propylene glycol methyl ether acetate (44.00 g). Approximately 1.0 mL of a solution of poly(4-vinylphenol) in ethyl lactate, available from Shipley Chemicals Ltd., Coventry, United Kingdom, was spin coated at 3000 rpm for 60 seconds on a four-inch unprimed silicon wafer. The coated wafer was post-apply baked on a SOLITEC hot plate at 240° C. for 10 minutes, producing a 5,830 angstrom thick coating. Approximately 0.5 mL of the resist solution was spin coated at 2000 rpm for 60 seconds on the poly(4-vinylphenol)-coated silicon wafer. The coated wafer was post-apply baked on a SOLITEC hot plate at 140° C. for 60 seconds producing a 790 angstrom thick coating. The coated wafer was exposed through a contact mask at 248 nm using a KrF laser (45 mJ/cm$^2$ delivered dose), and the exposed wafer was post-exposure baked on a SOLITEC hot plate at 140° C. for 60 seconds. The wafer was immersed in 0.26 N aqueous tetramethylammonium hydroxide for 60 seconds and rinsed with water. Examination of the wafer after development revealed that the resist coating had been completely removed down to the underlying layer of poly(4-vinylphenol) from the areas that had been exposed to actinic radiation, while the unexposed regions of the wafer showed no apparent erosion of the applied resist coating.

Example 11

A silicon wafer was coated with the polymer of Example 9, exposed, and developed in essentially the same manner described above with the following exceptions. The silicon wafer was not first coated with a poly(4-vinylphenol) solution; the photoresist solution was applied directly to the silicon wafer. The coated wafer was exposed at 13.4 nm (5 mJ/cm$^2$ delivered dose). Examination of the wafer after development revealed 100 nm resolved lines and spaces.

While the invention has been described in terms of several preferred embodiments in which the resist is applied in a bilayer system, those skilled in the art will recognize that the resist may also be utilized in single or multilayer systems and that the invention can be practiced with further modifications within the spirit and scope of the appended claims.

What is claimed is:

1. A method of forming resist patterns comprising the steps of:
   a) providing a polymer comprising a polymeric backbone having at least one pendant ester functional group having a tertiary carbon atom attached to the ester oxygen atom in which at least one organic substituent attached to the tertiary carbon atom comprises at least one silicon atom, wherein the silicon atom is attached to the tertiary carbon through a divalent connecting group selected from the group consisting of alkylene, arylene, cyclohexylene, and aralkylene;
   b) coating the silicon-containing polymer onto a substrate;
   c) exposing the coated substrate to actinic radiation sufficient to form a latent image; and
   d) developing the latent image.

2. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group selected from the group consisting of alkylene, arylene, cyclohexylene, and aralkylene.

3. A polymer according to claim 2 wherein polymeric backbone comprises a homopolymer or copolymer of vinyl phenols, (meth)acrylic acids, alkyl (meth)acrylates, maleic anhydrides, norbornenes, alkyl norbornenes, vinylbenzoic acids, alkyl vinylbenzoates, or olefins.

4. A polymer according to claim 2 wherein the substituents attached to the tertiary carbon atom are independently an alkyl, aryl, aralkyl, or silyl group or any two of the substituents are combined to form a cyclic group.

5. A polymer according to claim 2 wherein the polymeric backbone comprises a homopolymer or copolymer of maleic anhydrides, (meth)acrylic acids, norbornenes, alkyl (meth) acrylates, or combinations thereof.

6. A polymer according to claim 2 wherein the polymeric backbone comprises a homopolymer or a copolymer of maleic anhydride, acrylic acid, methacrylic acid, methyl acrylate, methyl methacrylate, tert-butyl acrylate, tert-butyl methacrylate, norbornene, norbornene methanol, norbornene carboxylic acid, 2-hydroxyethyl acrylate, 2-hydroxyethyl methacrylate, or combinations thereof.

7. A polymer according to claim 2 wherein that at least one substituent comprises at least 2 silicon atoms.

8. A polymer according to claim 2 wherein the substituents attached to the tertiary carbon atom are independently alkyl groups containing from 1 to 8 carbon atoms, (trialkylsilyl)alkyl, [(trialkylsilyloxy)dialkylsilyl]alkyl, [bis (trialkylsilyloxy)alkylsilyl]alkyl, [tris(trialkylsilyloxy)silyl] alkyl, [(trialkylsilyl)dialkylsilyl]alkyl, [bis(trialkylsilyl) alkylsilyl]alkyl, [tris(trialkylsilyl)silyl]alkyl, [tris (trialkylsilyl)methyl]alkyl, or {[tris(trialkylsilyl)methyl] dialkylsilyl}alkyl.

9. A polymer according to claim 2 wherein the substituents attached to the tertiary carbon atom are independently methyl, ethyl, 2-(trimethylsilyl)ethyl, 2-[(trimethylsiloxy) dimethylsilyl]ethyl, 2-[bis(trimethylsilyloxy)methylsilyl] ethyl, 2-[tris(trimethylsilyloxy)silyl]ethyl, 2-[(trimethylsilyl)dimethylsilyl]ethyl, 2-[bis(trimethylsilyl) methylsilyl]ethyl, 2-[tris(trimethylsilyl)silyl]ethyl, 3,3,3-tris (trimethylsilyl)propyl, 2-{tris(trimethylsilyl)methyl] dimethylsilyl}ethyl, or 2,2,2-tris(trimethylsilyl)ethyl.

10. A polymer according to claim 2 wherein the substituents attached to the tertiary carbon atom are independently methyl, ethyl, 2-[tris(trimethylsilyl)silyl]ethyl, 2-[tris (trimethylsilyloxy)silyl]ethyl, 3,3,3-tris(trimethysilyl) propyl, or 2-{tris(trimethylsilyl)methyl]dimethylsilyl}ethyl.

11. A polymer according to claim 2 wherein two of the substituents attached to the tertiary carbon atom are alkyl groups.

12. The polymer of claim 2 constructed of repeating monomer units represented by the formula:

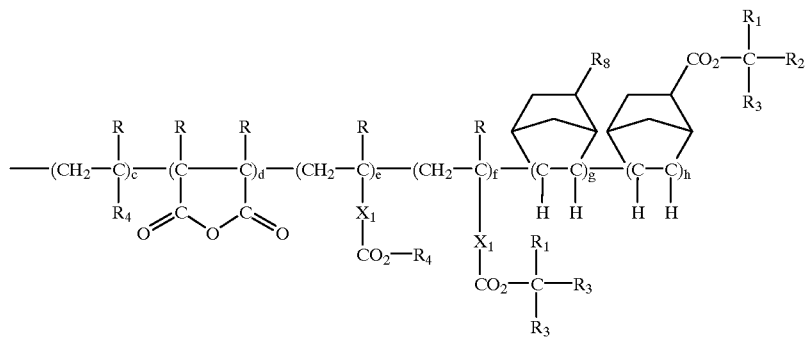

wherein each $X_1$ is independently a divalent connecting group or a covalent bond; each $R_4$ is independently a hydrogen atom, or an alkyl, aryl, or aralkyl group; each of $R_1$, $R_2$, and $R_3$ is independently an alkyl, aryl, aralkyl, or silyl group, with the proviso that at least one of and $R_1$, $R_2$, and $R_3$ is a silicon-containing group of the formula $X_2Si$ $(R_5)_3$, wherein $X_2$ is a divalent connecting group, and each $R_5$ is independently an alkyl, aryl, aralkyl, silyloxy, or silyl group; each $R_8$ is independently an alkyl, aryl, aralkyl, carboxyl, or alkoxy carbonyl group, or a hydrogen atom; c, d, e, f, g, and h are independently 0 or an integer 1 or greater, with the proviso that at least one of f or h is an integer 1 or greater; and each R is independently a hydrogen atom or a methyl group.

13. The polymer according to claim 12 wherein each of $R_1$, $R_2$, and $R_3$ is independently alkyl groups containing from 1 to 8 carbon atoms, (trialkylsilyl)alkyl, [(trialkylsilyloxy)dialkylsilyl]alkyl, [bis(trialkylsilyloxy) alkylsilyl]alkyl, [tris(trialkylsilyloxy)silyl]alkyl,

[(trialkylsilyl)dialkylsilyl]alkyl, [bis(trialkylsilyl)alkylsilyl]
alkyl, [tris(trialkylsilyl)silyl]alkyl, [tris(trialkylsilyl)methyl]
alkyl, and {[tris(trialkylsilyl)methyl]dialkylsilyl}alkyl.

14. The polymer according to claim 12 wherein each of $R_1$, $R_2$, and $R_3$ is independently methyl, ethyl, 2-(trimethylsilyl)ethyl, 2-[(trimethylsilyloxy)dimethylsilyl] ethyl, 2-[bis(trimethylsilyloxy)methylsilyl]ethyl, 2-[tris (trimethylsilyloxy)silyl]ethyl, 2-[(trimethylsilyl) dimethylsilyl]ethyl, 2-[bis(trimethylsilyl)methylsilyl]ethyl, 2-[tris(trimethylsilyl)silyl]ethyl, 3,3,3-tris(trimethylsilyl) propyl, 2-{tris(trimethylsilyl)methyl]dimethylsilyl}ethyl, and 2,2,2-tris(trimethylsilyl)ethyl.

15. The polymer according to claim 12 wherein each of $R_1$, $R_2$, and $R_3$ is independently methyl, ethyl, 2-[tris (trimethylsilyl)silyl]ethyl, 2-[tris(trimethylsilyloxy)silyl] ethyl, 3,3,3-tris(trimethysilyl)propyl, and 2-{tris (trimethylsilyl)methyl]dimethylsilyl}ethyl.

16. The polymer of claim 2 having the formula:

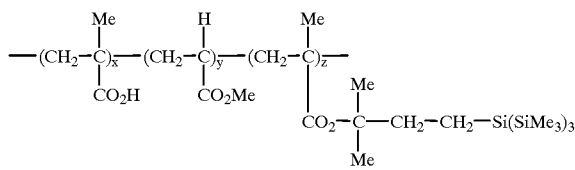

wherein x and y are 0 or an integer 1 or greater and z is an integer 1 or greater.

17. The polymer of claim 2 having the formula:

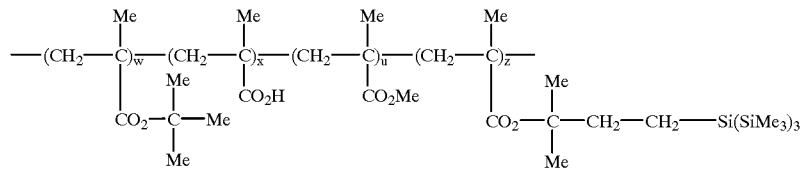

wherein w, x, and u are 0 or an integer 1 or greater and z is an integer 1 or greater.

18. The polymer of claim 2 having the formula:

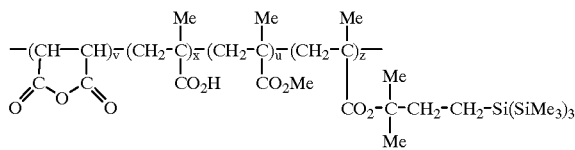

wherein v, x, and u are 0 or an integer 1 or greater and z is an integer 1 or greater.

19. The polymer of claim 2 having the formula:

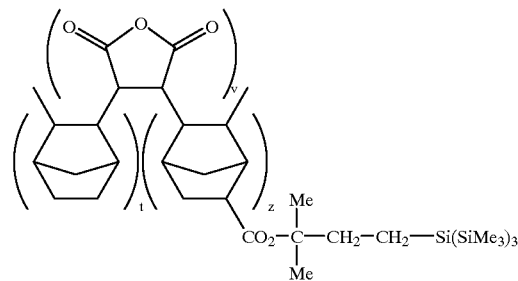

wherein t and v is 0 or an integer 1 or greater and z is an integer 1 or greater.

20. A resist composition comprising a mixture of the polymer of claim 2 and an acid generator.

21. The polymer of claim 2 wherein the divalent connecting group is an alkylene.

22. The polymer of claim 2 wherein the divalent connecting group is an ethylene.

23. A polymer comprising a polymeric backbone having at least one pendent ester functional group having a tertiary carbon atom attached to the ester oxygen atom in which at least one of the substituents attached to the tertiary carbon atom comprises at least one silicon atom, wherein the polymeric backbone comprises a homopolymer or copolymer of maleic anhydrides, (meth)acrylic acids, norbornenes, alkyl (meth)acrylates, or combinations thereof, and wherein the silicon atom is attached to the tertiary carbon through a divalent connecting group selected from the group consisting of alkylene, arylene, cyclohexylene, and aralkylene.

24. A polymer comprising a polymeric backbone having at least one pendent ester functional group having a tertiary carbon atom attached to the ester oxygen atom in which at least one of the substituents attached to the tertiary carbon atom comprises at least one silicon atom, wherein the polymeric backbone comprises a homopolymer or copolymer of maleic anhydride, acrylic acid, methacrylic acid, methyl acrylate, methyl methacrylate, tert-butyl acrylate, norbornenes, norbornenes methanol, norbornenes carboxylic acid, 2-hydroxyethyl acrylate, 2-hydroxyethyl methacrylate, or combinations thereof, and wherein the silicon atom is attached to the tertiary carbon through a divalent connecting group selected from the group consisting of alkylene, arylene, cyclohexylene, and aralkylene.

25. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the polymer is constructed of repeating monomer units represented by the formula:

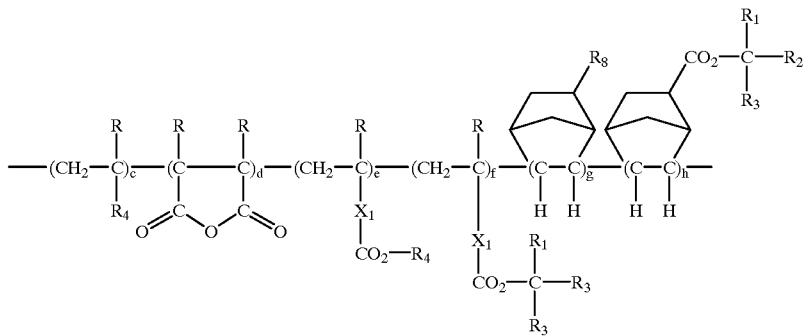

wherein each $X_1$ is independently a divalent connecting group or a covalent bond; each $R_4$ is independently a hydrogen atom, or an alkyl, aryl, or aralkyl group; each of $R_1$, $R_2$, and $R_3$ is independently selected from the group consisting of methyl, ethyl, 2-(trimethylsilyl)ethyl, 2-[(trimethylsilyloxy)dimethylsilyl]ethyl, 2-[bis(trimethylsilyloxy)methylsilyl]ethyl, 2-[tris(trimethylsilyloxy)silyl]ethyl, 2-[trimethylsilyl)dimethylsilyl]ethyl, 2-[bis(trimethylsilyl)methylsilyl]ethyl, 2-[tris(trimethylsilyl)silyl]ethyl, 3,3,3-tris(trimethylsilyl)propyl, 2-{tris(trimethylsilyl)methyl]dimethylsilylethyl, and 2,2,2-tris(trimethylsilyl)ethyl, with the proviso that at least one of $R_1$, $R_2$, and $R_3$ is not a methyl or an ethyl group; each $R_8$ is independently an alkyl, aryl, aralkyl, carboxyl, or alkoxy carbonyl group, or a hydrogen atom; c, d, e, f, g, and h are independently 0 or an integer 1 or greater, with the proviso that at least one of f or h is an integer 1 or greater; and each R is independently a hydrogen atom or a methyl group.

26. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the polymer is constructed of repeating monomer units represented by the formula:

2-[tris(trimethylsilyloxy)silyl]ethyl, 3,3,3-tris(trimethysilyl)propyl, and 2-{tris(trimethylsilyl)methyl]dimethylsilyl}ethyl, with the proviso that at least one of $R_1$, $R_2$, or $R_3$ is not a methyl or an ethyl group; each $R_8$ is independently an alkyl, aryl, aralkyl, carboxyl, or alkoxy carbonyl group, or a hydrogen atom; c, d, e, f, g, and h are independently 0 or an integer 1 or greater, with the proviso that at least one of f or h is an integer 1 or greater; and each R is independently a hydrogen atom or a methyl group.

27. A polymer comprising a polymeric backbone having at least one pendant ester functional group having a tertiary carbon atom attached to the ester oxygen atom in which at least one of the substituents attached to the tertiary carbon atom comprises at least one silicon atom, having the formula:

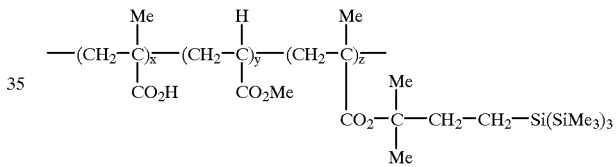

wherein x and y are 0 or an integer 1 or greater and z is an integer 1 or greater.

28. A polymer comprising a polymeric backbone having at least one pendant ester functional group having a tertiary

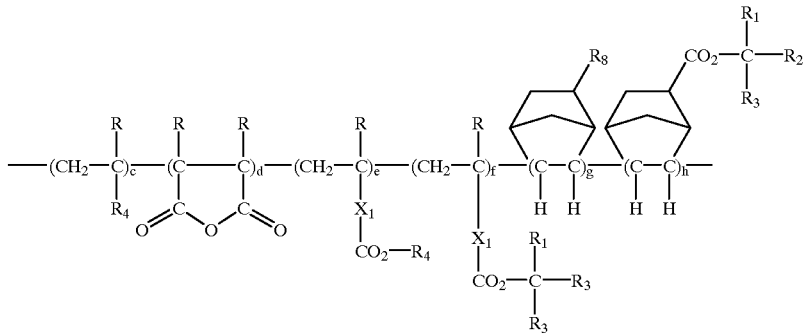

wherein each $X_1$ is independently a divalent connecting group or a covalent bond; each $R_4$ is independently a hydrogen atom, or an alkyl, aryl, or aralkyl group; each of $R_1$, $R_2$, and $R_3$ is independently selected from the group consisting of methyl, ethyl, 2-[tris(trimethylsilyl)silyl]ethyl, carbon atom attached to the ester oxygen atom in which at least one of the substituents attached to the tertiary carbon atom comprises at least one silicon atom, having the formula:

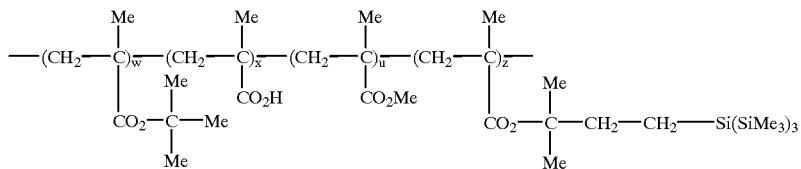

wherein w, x, and u are 0 or an integer 1 or greater and z is an integer 1 or greater.

29. A polymer comprising a polymeric backbone having at least one pendant ester functional group having a tertiary carbon atom attached to the ester oxygen atom in which at least one of the substituents attached to the tertiary carbon atom comprises at least one silicon atom, having the formula

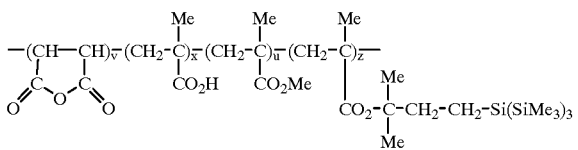

wherein v, x, and u are 0 or an integer 1 or greater and z is an integer 1 or greater.

30. A polymer comprising a polymeric backbone having at least one pendant ester functional group having a tertiary carbon atom attached to the ester oxygen atom in which at least one of the substituents attached to the tertiary carbon atom comprises at least one silicon atom, having the formula:

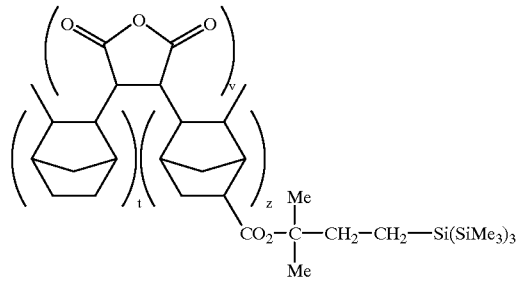

wherein t and v is 0 or an integer 1 or greater and z is an integer 1 or greater.

31. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the at least one substituent comprises at least 2 silicon atoms.

32. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the substituents attached to the tertiary carbon atom are independently alkyl groups containing from 1 to 8 carbon atoms, (trialkylsilyl)alkyl, [(trialkylsilyloxy)dialkylsilyl]alkyl, [bis(trialkylsilyloxy)alkylsilyl]alkyl, [tris(trialkylsilyloxy)silyl]alkyl, [(trialkylsilyl)dialkylsilyl]alkyl, [bis(trialkylsilyl)alkylsilyl]alkyl, [tris(trialkylsilyl)silyl]alkyl, [tris(trialkylsilyl)methyl]alkyl, or {[tris(trialkylsilyl)methyl]dialkylsilyl}alkyl.

33. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the substituents attached to the tertiary carbon atom are independently methyl, ethyl, 2-(trimethylsilyl)ethyl, 2-[(trimethylsiloxy)dimethylsilyl]ethyl, 2-[bis(trimethylsilyloxy)methylsilyl]ethyl, 2-[tris(trimethylsilyloxy)silyl]ethyl, 2-[(trimethylsilyl)dimethylsilyl]ethyl, 2-[bis(trimethylsilyl)methylsilyl]ethyl, 2-[tris(trimethylsilyl)silyl]ethyl, 3,3,3-tris(trimethylsilyl)propyl, 2-{tris(trimethylsilyl)methyl]dimethylsilyl}ethyl, or 2,2,2-tris(trimethylsilyl)ethyl.

34. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the substituents attached to the tertiary carbon atom are independently methyl, ethyl, 2-[tris(trimethylsilyl)silyl]ethyl, 2-[tris(trimethylsilyloxy)silyl]ethyl, 3,3,3-tris(trimethylsilyl)propyl, or 2-{tris(trimethylsilyl)methyl]dimethylsilyl}ethyl.

35. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the substituents attached to the tertiary carbon atom are independently methyl, ethyl, 2-[tris(trimethylsilyl)silyl]ethyl, 2-[tris(trimethylsilyloxy)silyl]ethyl, 3,3,3-tris(trimethylsilyl)propyl, or 2-{tris(trimethylsilyl)methyl]dimethylsilyl}ethyl, and wherein two of the substituents attached to the carbon atom are alkyl groups.

36. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the polymer is constructed of repeating monomer units represented by the formula:

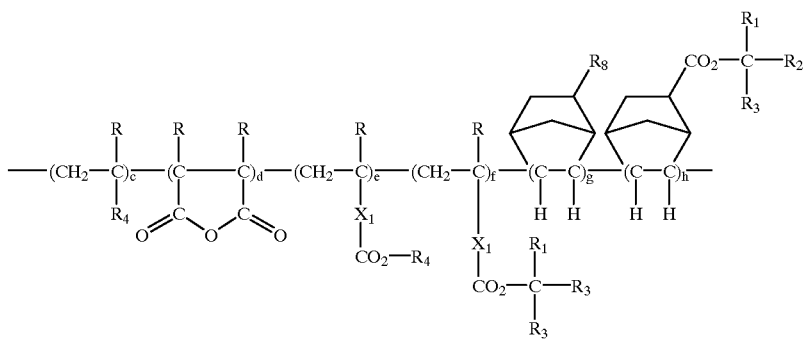

wherein each $X_1$ is independently a divalent connecting group or a covalent bond; each $R_4$ is independently a hydrogen atom, or an alkyl, aryl, or aralkyl group; each of $R_1$, $R_2$, and $R_3$ is independently selected from the group consisting of alkyl groups containing from 1 to 8 carbon atoms, (trialkylsilyl)alkyl, [(trialkylsilyloxy)dialkylsilyl]alkyl, [bis(trialkylsilyloxy)alkylsilyl]alkyl, [tris(trialkylsilyloxy)silyl]alkyl, [(trialkylsilyl)dialkylsilyl]alkyl, [bis(trialkylsilyl)alkylsilyl]alkyl, [tris(trialkylsilyl)silyl]alkyl, [tris(trialkylsilyl)methyl]alkyl, and {[tris(trialkylsilyl)methyl]dialkylsilyl}alkyl, with the proviso that at least one of $R_1$, $R_2$, and $R_3$ is not an alkyl group containing from 1 to 8 carbon atoms; each $R_8$ is independently an alkyl, aryl, aralkyl, carboxyl, or alkoxy carbonyl group, or a hydrogen atom; c, d, e, f, g, and h are independently 0 or an integer 1 or greater, with the proviso that at least one of f or h is an integer 1 or greater; and each R is independently a hydrogen atom or a methyl group.

37. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the polymer is constructed of repeating monomer units represented by the formula:

(trimethylsilyloxy)methylsilyl]ethyl, 2-[tris(trimethylsilyloxy)silyl]ethyl, 2-[(trimethylsilyl)dimethylsilyl]ethyl, 2-[bis(trimethylsilyl)methylsilyl]ethyl, 2-[tris(trimethylsilyl)silyl]ethyl, 3,3,3-tris(trimethylsilyl)propyl, 2-{tris(trimethylsilyl)methyl]dimethylsilyl}ethyl, and 2,2,2-tris(trimethylsilyl)ethyl, with the proviso that at least one of $R_1$, $R_2$, and $R_3$ is not a methyl or ethyl group; each $R_8$ is independently an alkyl, aryl, aralkyl, carboxyl, or alkoxy carbonyl group, or a hydrogen atom; c, d, e, f, g, and h are independently 0 or an integer 1 or greater, with the proviso that at least one of f or h is an integer 1 or greater; and each R is independently a hydrogen atom or a methyl group.

38. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the polymer is constructed of repeating monomer units represented by the formula:

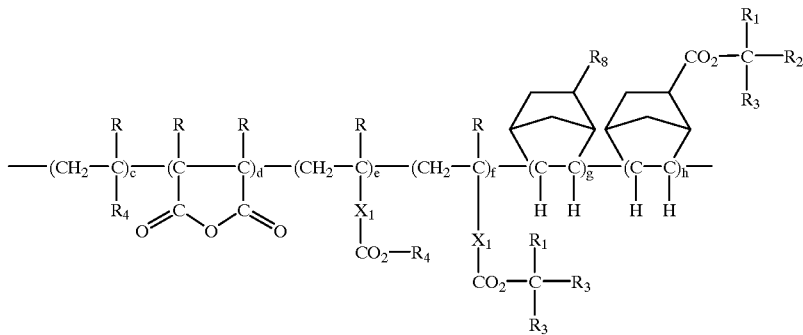

wherein each $X_1$ is independently a divalent connecting group or a covalent bond; each $R_4$ is independently a hydrogen atom, or an alkyl, aryl, or aralkyl group; each of $R_1$, $R_2$, and $R_3$ is independently selected from the group consisting of methyl, ethyl, 2-(trimethylsilyl)ethyl, 2-[(trimethylsilyloxy)dimethylsilyl]ethyl, 2-[bis

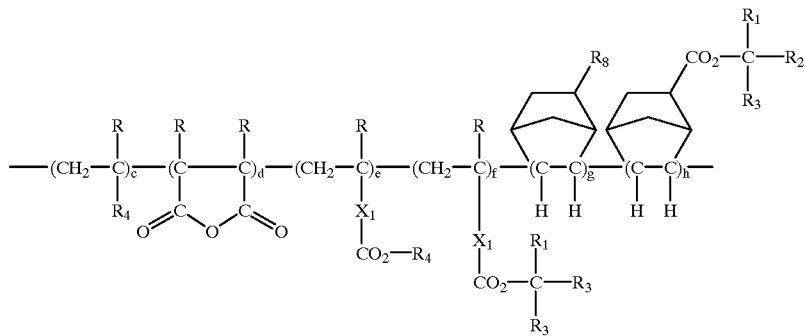

wherein each $X_1$ is independently a divalent connecting group or a covalent bond; each $R_4$ is independently a hydrogen atom, or an alkyl, aryl, or aralkyl group; each of $R_1$, $R_2$, and $R_3$ is independently selected from the group consisting of methyl, ethyl, 2-[tris(trimethylsilyl)silyl]ethyl, 2-[tris(trimethylsilyloxy)silyl]ethyl, 3,3,3-tris(trimethysilyl) propyl, and 2-{tris(trimethylsilyl)methyl]dimethylsilyl) }ethyl, with the proviso that at least one of $R_1$, $R_2$, and $R_3$ is not a methyl or ethyl group; each $R_8$ is independently an alkyl, aryl, aralkyl, carboxyl, or alkoxy carbonyl group, or a hydrogen atom; c, d, e, f, g, and h are independently 0 or an integer 1 or greater, with the proviso that at least one of f or h is an integer 1 or greater; and each R is independently a hydrogen atom or a methyl group.

39. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the polymer has the formula:

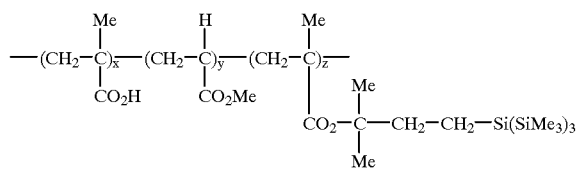

wherein x and y are 0 or an integer 1 or greater and z is an integer 1 or greater.

40. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the polymer has the formula:

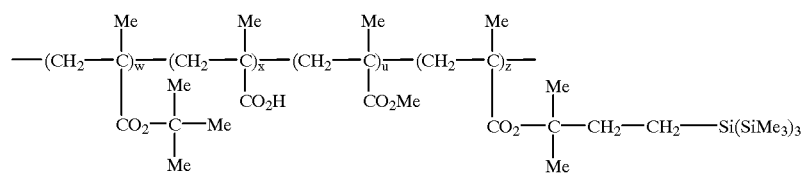

wherein w, x, and u are 0 or an integer 1 or greater and z is an integer 1 or greater.

41. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the polymer has the formula:

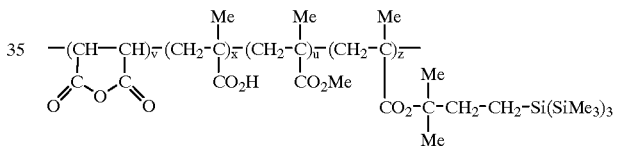

wherein v, x, and u are 0 or an integer 1 or greater and z is an integer 1 or greater.

42. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the polymer has the formula:

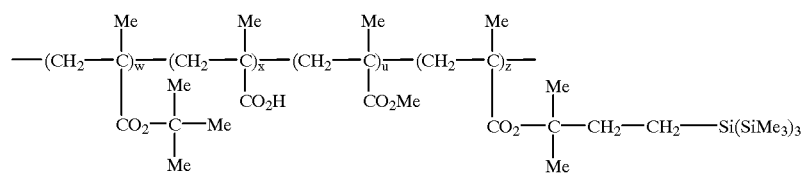

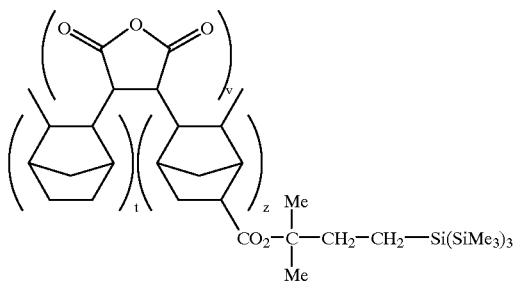

wherein t and v is 0 or an integer 1 or greater and z is an integer 1 or greater.

43. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the divalent connecting group is an alkylene.

44. A polymer comprising a polymeric backbone having at least one pendant ester functional group having a tertiary carbon atom attached to the ester oxygen atom in which at least one of the substituents attached to the tertiary carbon atom comprises at least one silicon atom, wherein the silicon atom is attached to the tertiary carbon through a divalent connecting group, and wherein the divalent connecting group is an ethylene.

45. An alcohol having the formula:

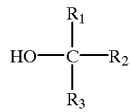

wherein each $R_1$, $R_2$, and $R_3$ is independently an alkyl, aryl, or silyl group, with the proviso that at least one of $R_1$, $R_2$, and $R_3$ is a silicon-containing group of the formula $X_2Si(R_5)_3$ wherein $X_2$ is an alkylene connecting group, and each $R_5$ is independently an alkyl, aryl, aralkyl, silyloxy, or silyl group.

46. An alcohol having the formula:

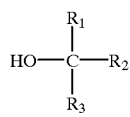

wherein each $R_1$, $R_2$, and $R_3$ is independently an alkyl, aryl, aralkyl, or silyl group, with the proviso that at least one of $R_1$, $R_2$, and $R_3$ is a silicon-containing group of the formula $X_2Si(R_5)_3$ wherein $X_2$ is an ethylene connecting group, and each $R_5$ is independently an alkyl, aryl, aralkyl, silyloxy or silyl group.

47. The alcohol of claim 46 wherein each $R_5$ is —$SiMe_3$.

48. The alcohol of claim 46 wherein each $R_5$ is —$OSiMe_3$.

49. The alcohol of claim 46 having the formula

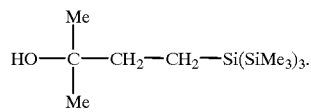

50. The alcohol of claim 46 having the formula

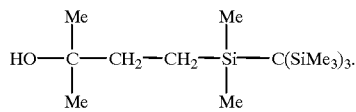

51. The alcohol of claim 46 having the formula

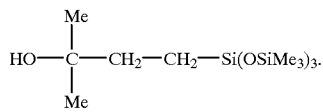

52. An alcohol having the formula:

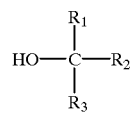

wherein each $R_1$, $R_2$, and $R_3$ is independently an alkyl, aryl, aralkyl, or silyl group, with the proviso that at least one of $R_1$, $R_2$, and $R_3$ is a silicon-containing group of the formula $X_2Si(R_5)_3$ wherein $X_2$ is a divalent connecting group, and each $R_5$ is independently an alkyl, aryl, aralkyl, silyloxy, or silyl group, and wherein at least one substituent comprises at least two silicon atoms.

53. The alcohol of claim 52 wherein $X_2$ is —$CH_2CH_2C(SiMe_3)_2{}^{31}$ .

54. The alcohol of claim 53 wherein each $R_5$ is Me.

55. An ester having the formula:

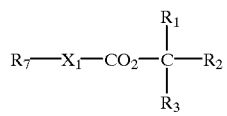

wherein each $R_1$, $R_2$, and $R_3$ is independently an alkyl, aryl, aralkyl, or silyl group, with the proviso that at least one of $R_1$, $R_2$, and $R_3$ is a silicon-containing group of the formula $X_2Si(R_5)_3$ wherein $X_2$ is an alkylene connecting group, each $R_5$ is independently an alkyl, aryl, aralkyl, silyloxy, or silyl group; $X_1$ is a divalent connecting group or a covalent bond; and $R_7$ is a divalent radical of monomers of vinyl phenols, (meth)acrylic acids, alkyl (meth)acrylates, maleic anhydrides, norbornenes, alkyl norbornenes, vinylbenzoic acids, alkyl vinylbenzoates, or olefins.

56. An ester having the formula:

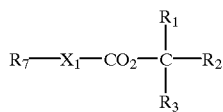

wherein each $R_1$, $R_2$, and $R_3$ is independently an alkyl, aryl, aralkyl, or silyl group, with the proviso that at least one of $R_1$, $R_2$, and $R_3$ is a silicon-containing group of the formula $X_2Si(R_5)_3$ wherein $X_2$ is a divalent connecting group, each $R_5$ is independently methyl, aryl, aralkyl, silyloxy, or silyl group; $X_1$ is a divalent connecting group or a covalent bond; and $R_7$ is a divalent radical of monomers of vinyl phenols, (meth)acrylic acids, alkyl (meth)acrylates, maleic anhydrides, norbornenes, alkyl norbornenes, vinylbenzoic acids, alkyl vinylbenzoates, or olefins.

57. An ester having the formula:

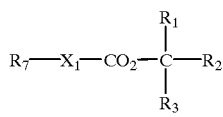

wherein each $R_1$, $R_2$, and $R_3$ is independently an alkyl, aryl, aralkyl, or silyl group, with the proviso that at least one of $R_1$, $R_2$, and $R_3$ is a silicon-containing group of the formula $X_2Si(R_5)_3$ wherein $X_2$ is an ethylene connecting group, each $R_5$ is independently alkyl, aryl, aralkyl, silyloxy, or silyl group; $X_1$ is a divalent connecting group or a covalent bond; and $R_7$ is a divalent radical of monomers of vinyl phenols, (meth)acrylic acids, alkyl (meth)acrylates, maleic anhydrides, norbornenes, alkyl norbornenes, vinylbenzoic acids, alkyl vinylbenzoates, or olefins.

58. The ester of claim 57 wherein each $R_5$ is methyl.

59. An ester having the formula:

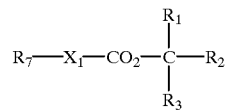

wherein each $R_1$, $R_2$, and $R_3$ is independently an alkyl, aryl, aralkyl, or silyl group, with the proviso that at least one of $R_1$, $R_2$, and $R_3$ is a silicon-containing group of the formula $X_2Si(R_5)_3$ wherein $X_2$ is a divalent connecting group, each $R_5$ is independently alkyl, aryl, aralkyl, silyloxy, or silyl group; $X_1$ is a divalent connecting group or a covalent bond; and $R_7$ is a divalent radical of monomers of vinyl phenols, (meth)acrylic acids, alkyl (meth)acrylates, maleic anhydrides, norbornenes, alkyl norbornenes, vinylbenzoic acids, alkyl vinylbenzoates, or olefins, and wherein at least one of the silicon-containing groups includes two or more silicon atoms.

* * * * *

UNITED STATES PATENT AND TRADEMARK OFFICE
CERTIFICATE OF CORRECTION

PATENT NO. : 6,358,675 B1
DATED : March 19, 2002
INVENTOR(S) : Boardman, Larry D.

It is certified that error appears in the above-identified patent and that said Letters Patent is hereby corrected as shown below:

Column 1,
Line 38, delete the word "inunersed" and insert in place thereof -- immersed --.

Column 12,
Line 32, delete "(1 16mg) " and insert in place thereof -- (116 mg) --.

Column 26,
Line 45, delete "$CH_2CH_2C(SiMe_3)_2^{31}$" and insert in place thereof
-- $CH_2CH_2C(SiMe_3)_2^-$ --.

Signed and Sealed this

Sixth Day of July, 2004

JON W. DUDAS
*Acting Director of the United States Patent and Trademark Office*